United States Patent
Pascucci (10) Patent No.: US 6,826,083 B2
(45) Date of Patent: Nov. 30, 2004

(54) METHOD FOR REDUCING SPURIOUS ERASING DURING PROGRAMMING OF A NONVOLATILE NROM

(75) Inventor: Luigi Pascucci, Sesto San Giovanni (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/426,924

(22) Filed: Apr. 29, 2003

(65) Prior Publication Data

US 2003/0235100 A1 Dec. 25, 2003

(30) Foreign Application Priority Data

Apr. 30, 2002 (EP) .............................................. 02425273

(51) Int. Cl.[7] .............................................. G11C 16/04
(52) U.S. Cl. .............................. 365/185.18; 365/185.23; 365/185.28
(58) Field of Search ...................... 365/185.18, 185.23, 365/185.28

(56) References Cited

U.S. PATENT DOCUMENTS

| | | | |
|---|---|---|---|
| 5,568,421 A | | 10/1996 | Aritome .................. 365/185.17 |
| 5,608,670 A | * | 3/1997 | Akaogi et al. ........... 365/185.18 |
| 5,617,350 A | | 4/1997 | Roohparvar ............. 365/185.02 |
| 5,619,450 A | * | 4/1997 | Takeguchi et al. ........ 365/185.23 |
| 5,677,875 A | | 10/1997 | Yamagata et al. ......... 365/185.26 |
| 5,966,603 A | | 10/1999 | Eitan ........................ 438/258 |
| 6,215,148 B1 | | 4/2001 | Eitan ........................ 257/316 |
| 6,222,761 B1 | | 4/2001 | Gerber et al. ............. 365/185.02 |
| 2002/0006059 A1 | | 1/2002 | Gerber et al. ............. 365/185.02 |
| 2003/0039153 A1 | * | 2/2003 | Maayan et al. ........... 365/200 |
| 2003/0142544 A1 | * | 7/2003 | Maayan et al. ........... 365/185.16 |

FOREIGN PATENT DOCUMENTS

| | | |
|---|---|---|
| EP | 1 227 498 A2 | 7/2002 |
| WO | WO 99/07000 | 2/1999 |

* cited by examiner

*Primary Examiner*—Huan Hoang
(74) *Attorney, Agent, or Firm*—Lisa K. Jorgenson; Harold H. Bennett, II; Seed IP Law Group PLLC (57) ABSTRACT

An NROM memory device, wherein the memory cells are provided with charge storage regions of insulating material, such as silicon nitride. The memory device includes a row decoder comprising a plurality of drivers; during programming, a first driver supplies a first voltage having a first value to a selected wordline, while the other drivers are configured so as to supply a second voltage having a second non-zero value, lower than the first value, to the other wordlines. Thereby, the gate-drain voltage drop of the deselected cells is reduced, and thus spurious erasing of the deselected cells connected to the selected bitline is reduced. Consequently, the reliability of the memory device is improved considerably and the life thereof is lengthened, thanks to the reduction in the charge injected into the charge storage region.

16 Claims, 5 Drawing Sheets

|  | SELECTED CELL | DESELECTED CELL | DESELECTED CELL NOT CONNECTED TO THE SELECTED BITLINE |
|---|---|---|---|
| $V_G$ | 9V | 1V | 1V |
| $V_D$ | HIGH (4-6.5V) | HIGH (4-6.5V) | 0V |
| $V_S$ | 0V | 0V | 0V |

METHOD FOR REDUCING SPURIOUS ERASING DURING PROGRAMMING OF A NONVOLATILE NROM

BACKGROUND OF THE INVENTION

1. Field of the Invention

The present invention relates to a method for reducing spurious erasing during programming of a memory array of a nonvolatile NROM.

2. Description of the Related Art

Figure 1:
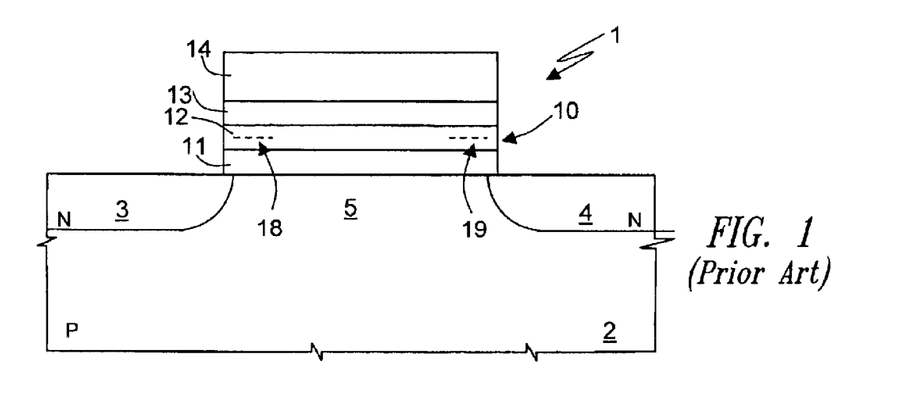
FIG. 1 shows the general structure of an NROM cell.

As is known, nonvolatile NROMs (nitride read-only memories) are formed by memory cells having an information-storage area of insulating material, namely silicon nitride. The general structure of a NROM cell is shown in FIG. 1. A NROM cell 1 is formed in a substrate 2 housing a first conductive region 3 and a second conductive region 4, separated by a channel region 5. On top of the channel region 5 is a triple insulating layer 10 formed by a first oxide region 11, a nitride region 12 and a second oxide region 13. A control gate region 14 extends on top of the insulating triple layer 10. A cell of this type is, for example, described in WO-A-99 07000, which is incorporated herein, by reference.

In cells of this type, the nitride region 12 operates as a charge local retention region. In fact, during programming, if a high programming voltage is applied to the first conductive region 3, electrons flow towards the end of the nitride layer near the first conductive region 3 (which, in this situation, acts as the drain region in nonvolatile cells of the EPROM or flash type), and these electrons remain trapped in this area (first storage area 18 in FIG. 1). If, instead, a high programming voltage is applied to the second conductive region 4, electrons flow towards the end of the nitride layer near the second conductive region 4 (which, in this situation, acts as the drain region), and these electrons remain trapped in this area (second storage area 19).

Since programming of each storage area 18, 19 determines a different electrical behavior of the cell 1, according to whether the first storage area 18, the second storage area 19, neither of them or both of them are programmed, four different electrical configurations are obtained, and the cell is able to store two bits.

Reading of the cell entails verification of the programmed or non-programmed state of both of the storage areas 18, 19. To this aim, when the state of the first storage area 18 is to be read, a read voltage (for example, 1.5 V) is applied to the second conductive region 4 (drain region), the control gate region 14 is biased (for example, at 3 V), and the second conductive region 3 (source) is grounded. A depletion region is therefore created in the channel region 5 and near the second conducting region 4. Furthermore, an inversion region is created along the channel 5. If the first storage area 18 has not been programmed, the depletion region reaches the first conductive region 3, the cell 1 is conductive, and a "0" is read. If, instead, the first storage area 18 has been programmed, the depletion region is unable to reach the first conductive region 3, the cell 1 is off, and a "1" is read.

Likewise, by inverting the biasing voltages and then applying a read voltage to the first conductive region 3 and connecting the second conductive region 4 to ground, it is possible to detect whether the second storage area 19 has been programmed (bit "1") or not (bit "0").

Erasing of this type of cell is performed via injection of holes in the storage areas 18, 19, which holes combine with the electrons and neutralize the effect of the stored charge. Since erasing does not entail extraction of charges from the storage area or areas, as, instead, for standard nonvolatile memories, but entails injection of charges of opposite sign, the writing capacity of a cell of this type is limited by the maximum storage capacity of the nitride layer 12, and, once the latter is reached, the cell is saturated and is no longer usable (low cycling).

For this reason, it becomes essential to reduce the amount of charges injected each time in the storage areas 18, 19. Furthermore, it is also important to prevent undesired injection of charges due to spurious effects.

In order to control the quantity of charge injected during programming, the programming voltage is kept as low as possible, and programming is interrupted once the threshold voltage is reached. To this end, the programming voltage is supplied as pulses of increasing amplitude, and after each pulse the threshold reached is verified.

In order to eliminate spurious injection, it is instead important to prevent situations that are dangerous in this regard. One of these situations occurs, for instance, during programming of a cell, owing to the unavoidable biasing of the deselected cells, which are electrically connected to the cell to be programmed.

Figure 2:
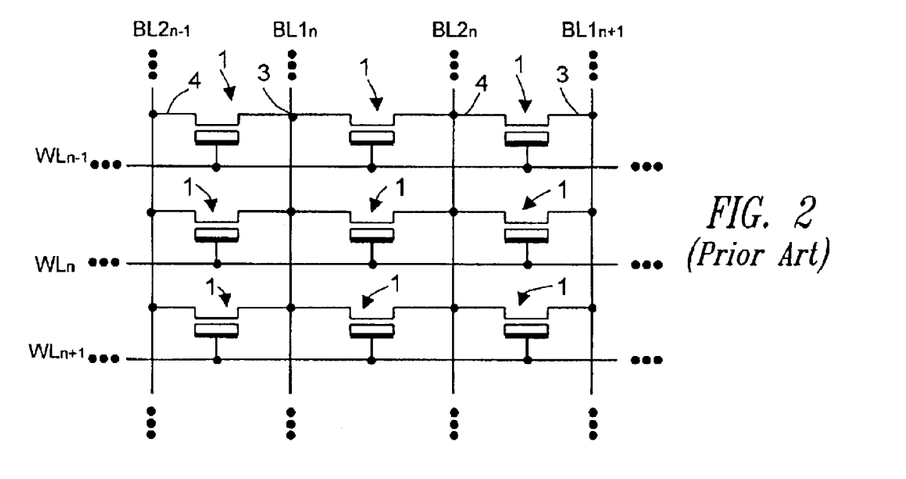
FIG. 2 shows the schematic circuit connection diagram of some cells of an NROM memory array.
Figure 3:
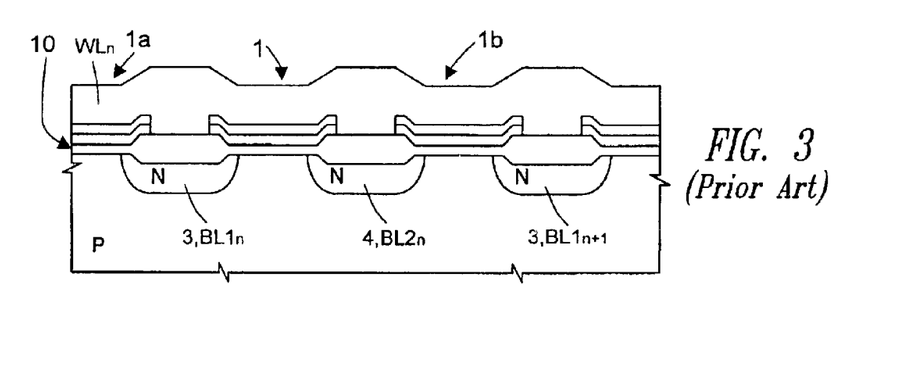
FIG. 3 shows a cross-section through a chip of semiconductor material, which integrates an NROM memory.

In fact, like other types of memory, nonvolatile NROMs are characterized by an organization of the memory array wherein a number of cells have conductive regions connected to one another by bitlines. In particular, the cells form an array aligned along rows and columns, wherein, for example, the cells arranged in a same row are connected to a same wordline WL forming the gate regions 14 of the cells themselves, and the cells arranged in a same column are connected to the same bitlines BL1, BL2 forming the first and the second conductive regions 3, 4 (see FIG. 2). Furthermore, frequently two adjacent cells in the direction of the rows share a same conductive region 3, 4. For instance, as illustrated in FIG. 3, a cell 1 shares the first conductive region 3 (formed, for example, by the first bitline BL1n) with a cell 1a set on its left, and the second conductive region 4 (formed by the bitline BL2n) with a cell 1b set on its right (virtual ground architecture).

Consequently, any voltage applied to a bitline 3, 4 is common to all the cells connected to the same line. Consequently, during programming of the memory array, when a cell of a generic packet is programmed, also the cells connected to the same bitlines 3, 4 are biased. In this situation, the deselected cells connected to the bitline biased at programming voltage and thus arranged in the same column and in the adjacent column to the cell to be programmed, are in a erase-like or spurious erasing configuration. In fact, in order to prevent programming, a gate voltage $V_G=0$ V is applied to these cells. However, the configuration with a first conductive region at a high voltage and the gate region at 0 V is precisely the erasing configuration of this type of memory.

As a result, on the cells connected to the cell to be programmed spurious injection conditions are present, which determine a degrading of the programming levels previously stored in these cells.

The spurious erasing that occurs at each programming cycle is quite mild thanks to the limited programming voltage during programming (values ranging from 4 V to 6.5 V in case of programming and values ranging from 7.5 V to 8.2 V in case of an effective erasing). Nevertheless, spurious erasing, even if mild, has some negative repercussions both on the reliability of the cell modification system and on the number of cells that can be connected to the same source and drain lines.

In fact, even though the variation in the threshold voltage does not manifest itself at a visible level (thanks to the limited time duration of the programming pulse), spurious erasing causes undesired accumulation of holes inside the cell. Furthermore, the accumulation occurs with charges that have paths that favor their trapping in the intermediate part of the nitride region, above the channel region of the cell. This entails a limitation of the cycling characteristics of the device, which has negative effects that are particularly marked in the case of memories of the type considered, for the reasons explained above.

The above mentioned problem of spurious erasing is the more severe the higher the programming voltage and can be particularly limiting in case of lots of cells having a low programming speed. Furthermore, the problem is all the more felt the longer the bitlines, since in this case programming of a single cell causes spurious erasing of a high number of cells. In addition, as the likelihood of programming more cells connected to the same bitlines increases, on the one hand, the likelihood that the sum of the spurious erasing effects causes an erasing proper also increases, and, on the other hand, the likelihood that a cell that has just been programmed (the injected charge whereof is as limited as possible to increase cycling, as explained above) being able to exit from the programmed condition just reached increases. In order to reduce the incidence of spurious erasing, it is therefore necessary to provide a high number of sectors or subsectors, with bitlines of reduced length. The increase in the number of bitlines (with breaking-up into a lot of lines) makes it necessary to provide a high number of selectors, one for each bitline. However, since the selectors and the corresponding control lines involve a large occupation of area, the result is a large overall occupation of the memory array.

BRIEF SUMMARY OF THE INVENTION

The aim of the present invention is therefore to reduce the problem of spurious erasing during programming of NROM cells, so as to increase cycling and reduce the dimensions of the memory array.

According to the invention, a method for programming an NROM nonvolatile memory array and a corresponding memory device are provided.

An embodiment of the invention provides a method for programming a memory array of a NROM nonvolatile memory comprising a plurality of memory cells organized in rows and columns and provided with first conductive regions formed in a semiconductor body and connected to first bitlines, second conductive regions formed in the semiconductor body and connected to second bitlines, charge storage regions of insulating material, formed on top of the semiconductor body, and gate regions arranged on top of the charge storage regions and connected to respective wordlines. The method comprises the steps of applying a first voltage to a selected one of the wordlines, the first voltage having a first value with respect to the semiconductor body, and applying a second voltage having a second non-zero value, lower than the first value, to a plurality of the wordlines excluding the selected wordline.

Another embodiment of the invention provides a an NROM device having a memory array, including a first plurality of bitlines, a second plurality of bitlines, a plurality of wordlines, a plurality of memory cells, and a programming circuit. The memory cells are organized in rows and columns and provided with first conductive regions formed in a semiconductor body, each connected to one of the first plurality of bitlines, second conductive regions formed in the semiconductor body, each of the second conductive regions connected to one of the second plurality of bitlines, charge storage regions of insulating material formed on top of the semiconductor body, and gate regions arranged on top of the charge storage regions and connected to respective ones of the plurality of wordlines. A programming circuit for a selected cell is connected to a selected one of the plurality of wordlines. The programming circuit comprises a plurality of drivers, including a first driver and second drivers, the first driver supplying a first voltage of a first value with respect to the semiconductor body to the selected one of the wordlines, and the second drivers configured to supply a second voltage having a second non-zero value, lower than the first value, to each of the plurality of the wordlines, excluding the selected wordline.

BRIEF DESCRIPTION OF THE SEVERAL VIEWS OF THE DRAWINGS

For an understanding of the present invention a preferred embodiment thereof is now described, purely by way of non-limiting example, with reference to the attached drawings, wherein.

DETAILED DESCRIPTION OF THE INVENTION

According to one aspect of the invention, in order to limit the effects of spurious erasing during programming of a cell, the gate voltage of at least the cells that are not to be programmed but have source or drain terminals connected to the cell to be programmed is increased. To this end, the deselected wordlines are biased with a low positive voltage, i.e., lower than the read voltage. This voltage may be in a range of about 0.5–1.5 volts, or between 0.75V and 1.25V, in a preferred embodiment.

Figures 4, 5, 6:
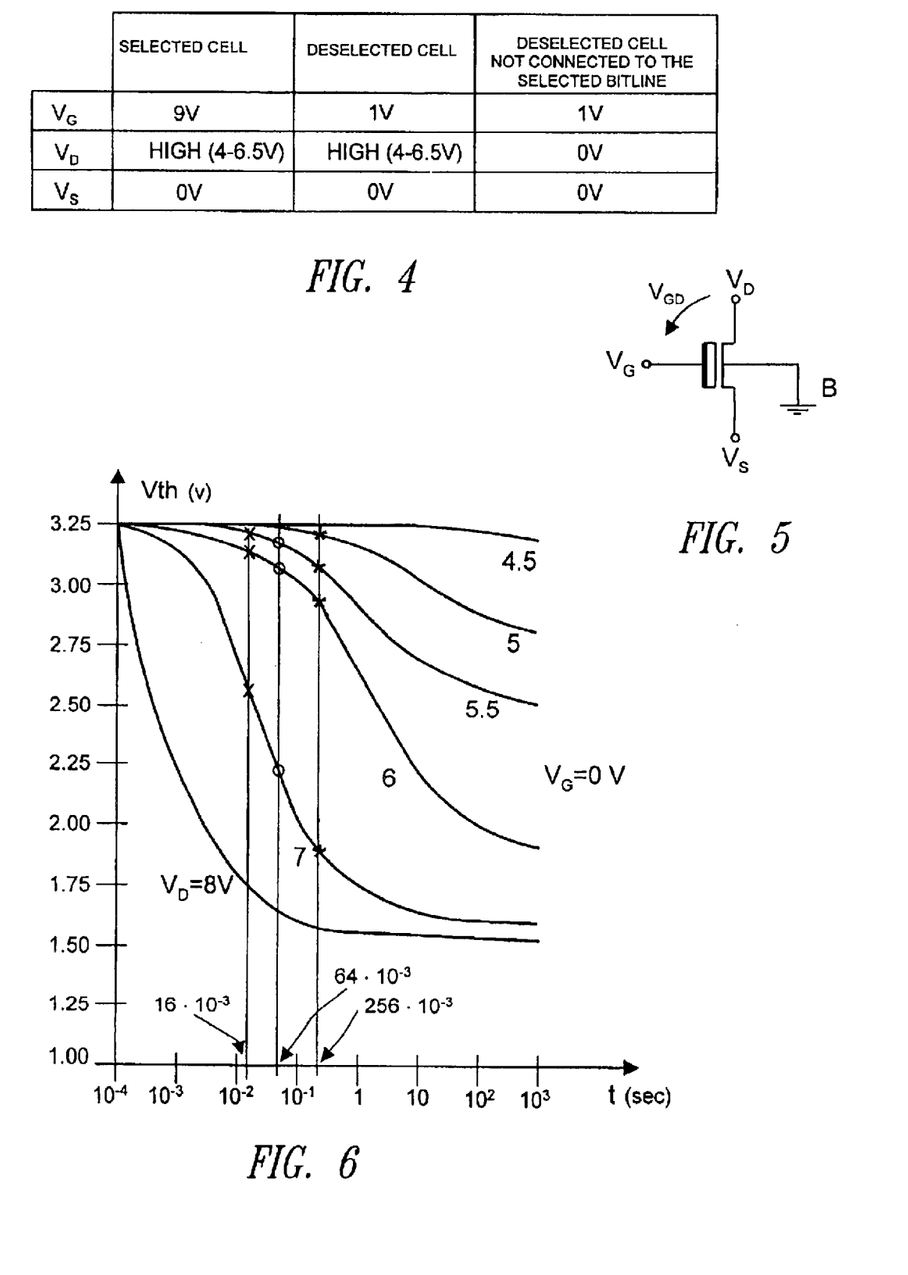
FIG. 4 presents a table of the biasing voltages according to an embodiment of the present method.
FIG. 5 shows the equivalent electrical circuit of an NROM cell and the biasing voltages applied.
FIG. 6 shows the plots of the threshold voltage as a function of erasing time and the drain voltage.

Since the NROM cells are not affected by the problem of depletion and have a threshold voltage of at least 1.7 V, it is possible to keep the biasing voltage of the deselected wordlines at approx. 1 V. FIG. 4 shows a table of the biasing voltages applied respectively to a cell to be programmed, to a deselected cell connected to the selected bitline, and to a deselected cell not connected to the selected bitline, using the symbology adopted in FIG. 5, which illustrates the electrical symbol of an NROM cell. In particular, $V_G$ designates the voltage applied to the wordlines; $V_D$ designates the voltage applied to the bitlines connected to the conductive regions operating as drain regions; and $V_S$ designates the voltage applied to the bitlines connected to the conductive regions operating as source regions. All the voltages are measured with respect to the potential of the substrate 2, designated by the letter B in FIG. 5.

The increase in the gate voltage thus obtained considerably reduces the transverse field, which, together with the simultaneous biasing condition of the region operating as drain, is responsible for spurious erasing. The limitation of the transverse field significantly reduces the trapping capacity of the nitride, since the potential difference $V_{GD}$ between the gate region and the conduction region operating as drain is reduced by the same amount by which the gate voltage has increased (1 V).

The above is evident from FIG. 6, which shows the plots of the threshold voltage Vth as a function of the spurious erasing time for an NROM cell biased with a gate voltage $V_G$=0 V for drain voltages $V_D$=8, 7, . . . , 4.5 V, starting from an initial threshold voltage Vth=3.25 V. Marked on the curves are the final threshold voltage levels in the worst case, when a sector comprises 32 rows (points indicated by a cross), 128 rows (points indicated by a circle), and 512 rows (points indicated by a star), and when programming of each cell requires 25 programming pulses of a duration of 10 $\mu$s. On the above hypotheses, taking into account that pairs of adjacent cells share the same bitline (and that thus each cell undergoes the phenomenon of spurious programming both when a cell set in the same column is programmed and when a cell set in the adjacent column, which has in common the bitline biased by the same drain voltage, is programmed), when all the cells of the sector are programmed, overall spurious erasing times of 16 ms, 64 ms and 256 ms are obtained, according to whether the sector comprises 32, 128 and 512 rows, respectively.

As may be noted, for a 512-row sector and programming voltage $V_D$=7 V, the worst case brings about a reduction in the threshold voltage below 2 V, to a value close to the read voltage, which thus risks yielding an erroneous result. Instead, by increasing the gate voltage to $V_G$=1 V, the potential difference $V_{GD}$ existing on the deselected cells connected to the selected bitline, is reduced by 1 V and thus these deselected cells follow the trend of the curve $V_D$=6 V, a trend which is much less dangerous.

If programming is instead carried out at $V_D$=5.5 V, the cells behave as on the curve $V_D$=4.5 V and thus, practically, do not undergo spurious erasing even in the case of a sector with a large number of rows (512).

Figure 7:
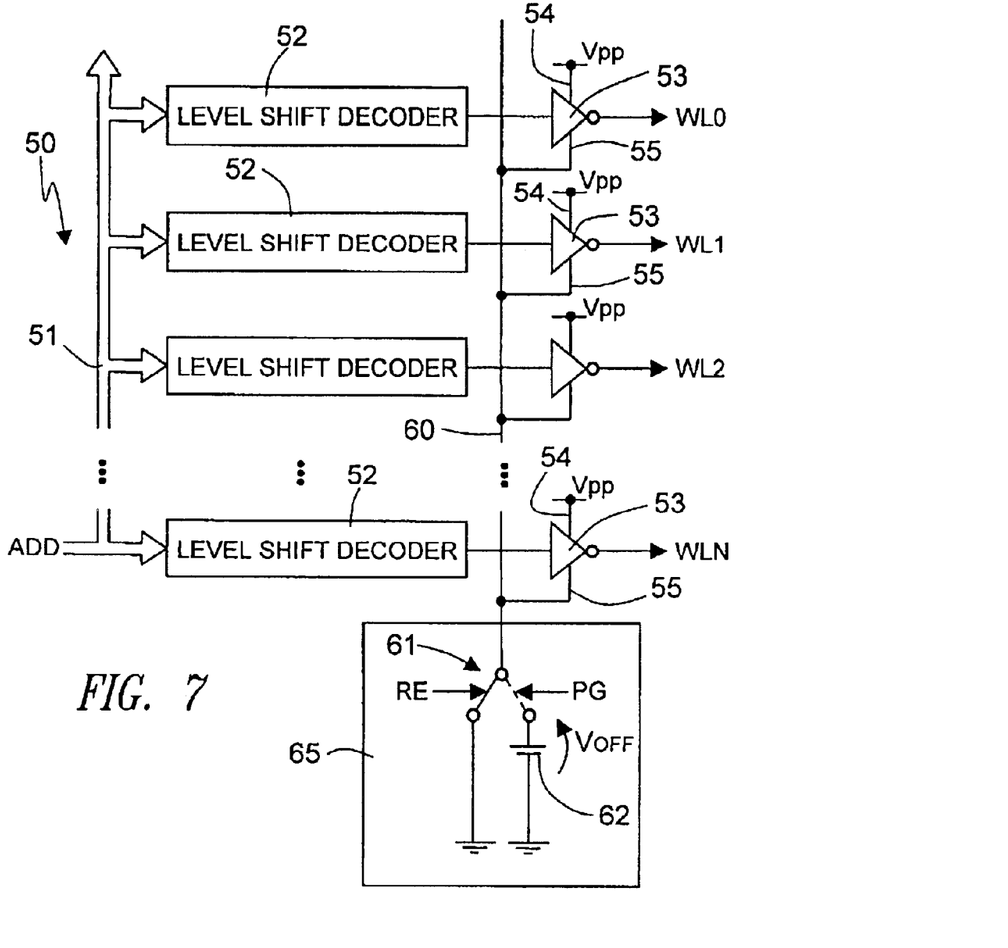
FIG. 7 shows a block diagram for a final row decoder implementing the method according to the invention.

FIG. 7 shows a schematic circuit diagram of a final row decoder that is able to supply gate voltages according to the invention.

A final decoder 50 comprises a bus 51, supplying address signals ADD, which encode the row address of the sector to be programmed. The address signals ADD are supplied to a plurality of level-shift decoders 52, one for each row of the sector. The output of each level-shift decoder 52 is connected to the signal input of a respective row driver 53, which has a first and a second supply input 54, 55. The first supply input 54 of all the drivers 53 is connected to a supply line, which, during programming, is set to the row programming voltage Vpp (for example, 9 V), and the second supply input 55 of all the drivers 53 is connected to a biasing line 60. Each of the outputs of the drivers 53 is connected to a respective wordline WL in a known way.

The biasing line 60 is connected to a biasing circuit 65, which has the function of feeding the biasing line 60 with the ground voltage (0 V) or a row offset voltage Voff (for example, 1 V) according to the operating step. The generator circuit 65 is here represented schematically as a changeover switch 61 that connects the biasing line 60 to a ground line or to a voltage generator 62, which supplies the row offset voltage Voff. The changeover switch 61 is controlled by a programming control signal Pg and by a read/erase control signal RE, it not being possible for both of these to be simultaneously in the active state (for example, at a high logic level). In this case, the programming control signal Pg is high during the erasing step and the read/erase control signal RE is high during reading and erasing.

During programming, the programming control signal Pg is high, and the changeover switch 61 connects the biasing line 60 to the generator 62. In a known way, all the outputs of the level-shift decoders 52 are high, except for the one corresponding to the selected wordline WL0, WL1, . . . , WLN to which the cells to be programmed belong. Thus, the driver 53 connected to the cells to be programmed outputs the programming voltage Vpp, while all the other drivers 53 outputs the row offset voltage Voff. In this way, all the deselected cells receive on their gate terminal the offset voltage Voff, and the deselected cells connected to the bitline which receives the drain programming voltage $V_D$ have a potential difference $V_{GD}$=$V_D$−Voff.

During reading and erasing, instead, the changeover switch connects the biasing line 60 to ground.

Figure 8:
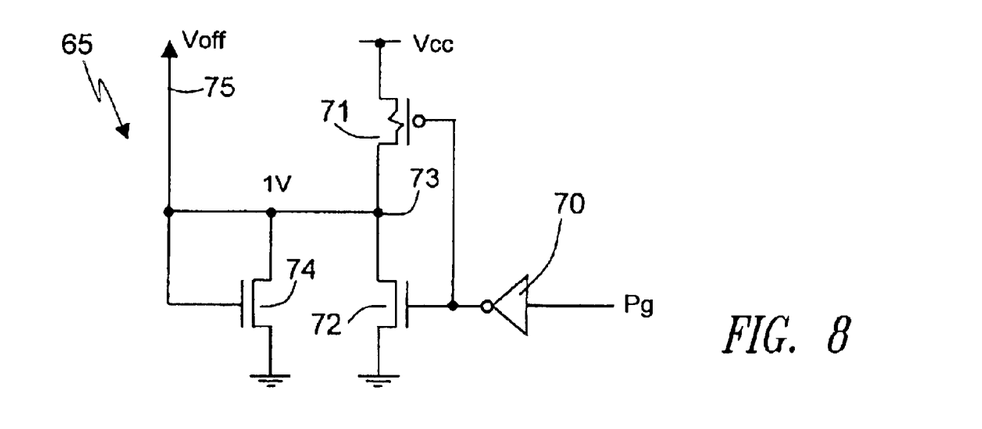
FIG. 8 is a schematic circuit diagram of a possible embodiment of a component of the diagram of FIG. 7.

FIG. 8 shows an embodiment of the biasing circuit 65. The biasing circuit 65 comprises an inverter 70 having an input, which receives the programming control signal Pg, and an output connected to the gate terminal of a PMOS transistor 71 and to the gate terminal of a first NMOS transistor 72. The PMOS transistor 71 and the NMOS transistor 72 are connected together in series between a supply line at Vcc and ground, and form an inverter circuit. The PMOS transistor 71 is of the resistive type. The intermediate node 73 between the PMOS transistor 71 and the NMOS transistor 72 is connected to the drain terminal of a second diode-connected NMOS transistor 74, which thus has its gate terminal connected to the drain terminal and forms an output 75 of the biasing circuit 65. The source terminal of the second NMOS transistor 74 is grounded.

When the programming control signal Pg is high, the output of the inverter 70 is low. Consequently, the first NMOS transistor 72 is off and the PMOS transistor 71 is on and takes the intermediate node 73 to the supply voltage. Thus, the second NMOS transistor 74 is on and forms, with the PMOS transistor 71, a resistive divider. The resistance ratio between the PMOS transistor 71, which, as said, is sized so as to be rather resistive, and the second NMOS transistor 74 determines the voltage on the intermediate node 73 and thus on the output 75. According to the supply voltage Vcc and by appropriately sizing the transistors 71, 74, it is possible to obtain the desired value for the row offset voltage Voff, for example 1 V.

Instead, when the programming control signal Pg is low, the output of the inverter 70 is high. The PMOS transistor 71 is off, whereas the first NMOS transistor 72 is on and keeps the output 75 of the biasing circuit 65 grounded and the second NMOS transistor 74 off.

The advantages of the method described herein are described hereinafter. First, the described method, by enabling a voltage drop reduction between gate and drain of the deselected cells, reduces spurious erasing to a negligible level, even if it is repeated. Thereby, the reliability of the memory is improved considerably, in a more than linear way, and the life thereof is lengthened, thanks to the reduction in the charge injected in the nitride region 12. In fact, by limiting the spurious erasing disturbance, it is not necessary to inject charge in excess during programming in order to prevent erasing of the already programmed cell, and it is thus possible to limit the overall injected charges and, consequently, to increase cycling of the memory.

Figure 9:
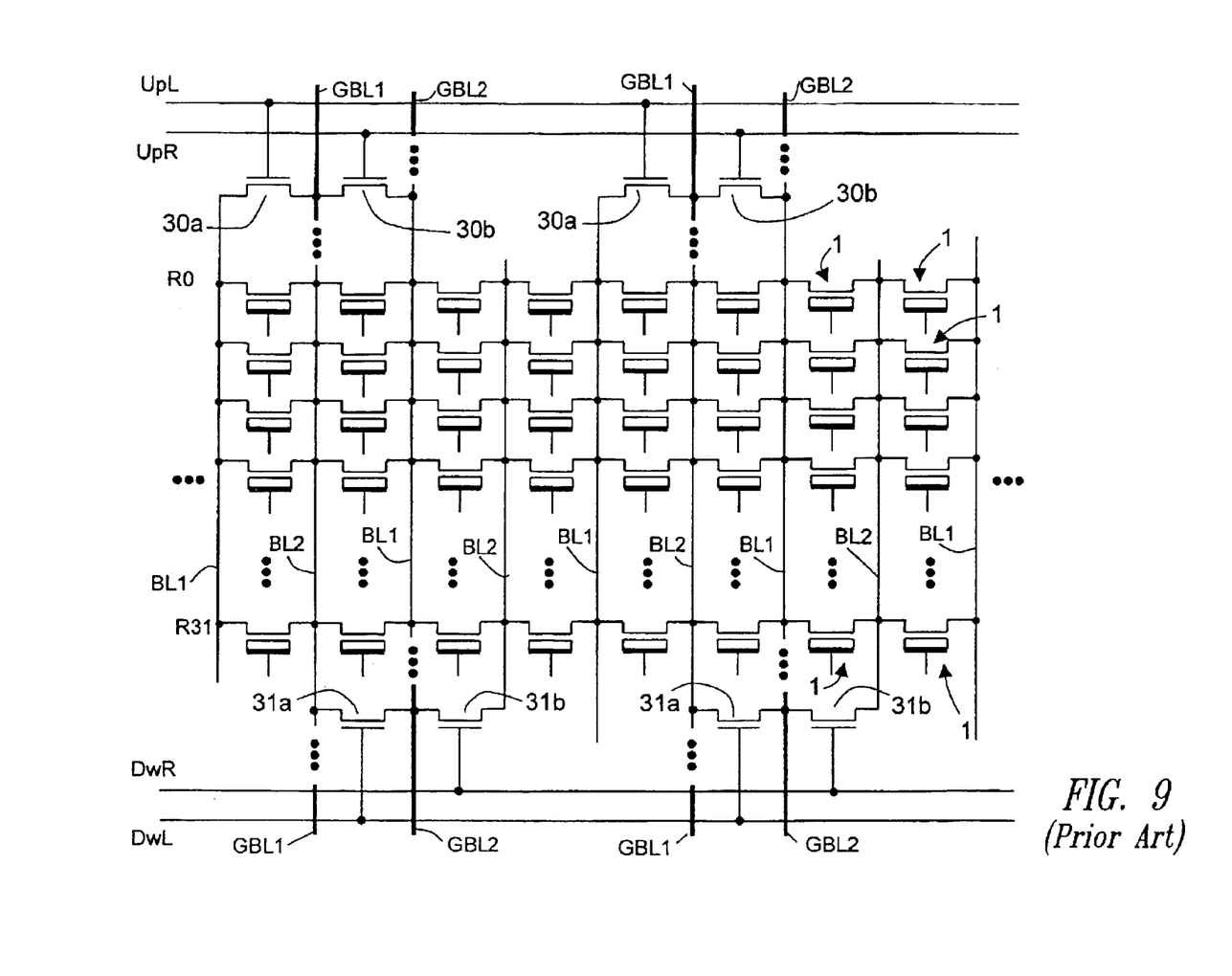
FIG. 9 shows the known architecture of a portion of an NROM memory array comprising 32 rows.
Figure 10:
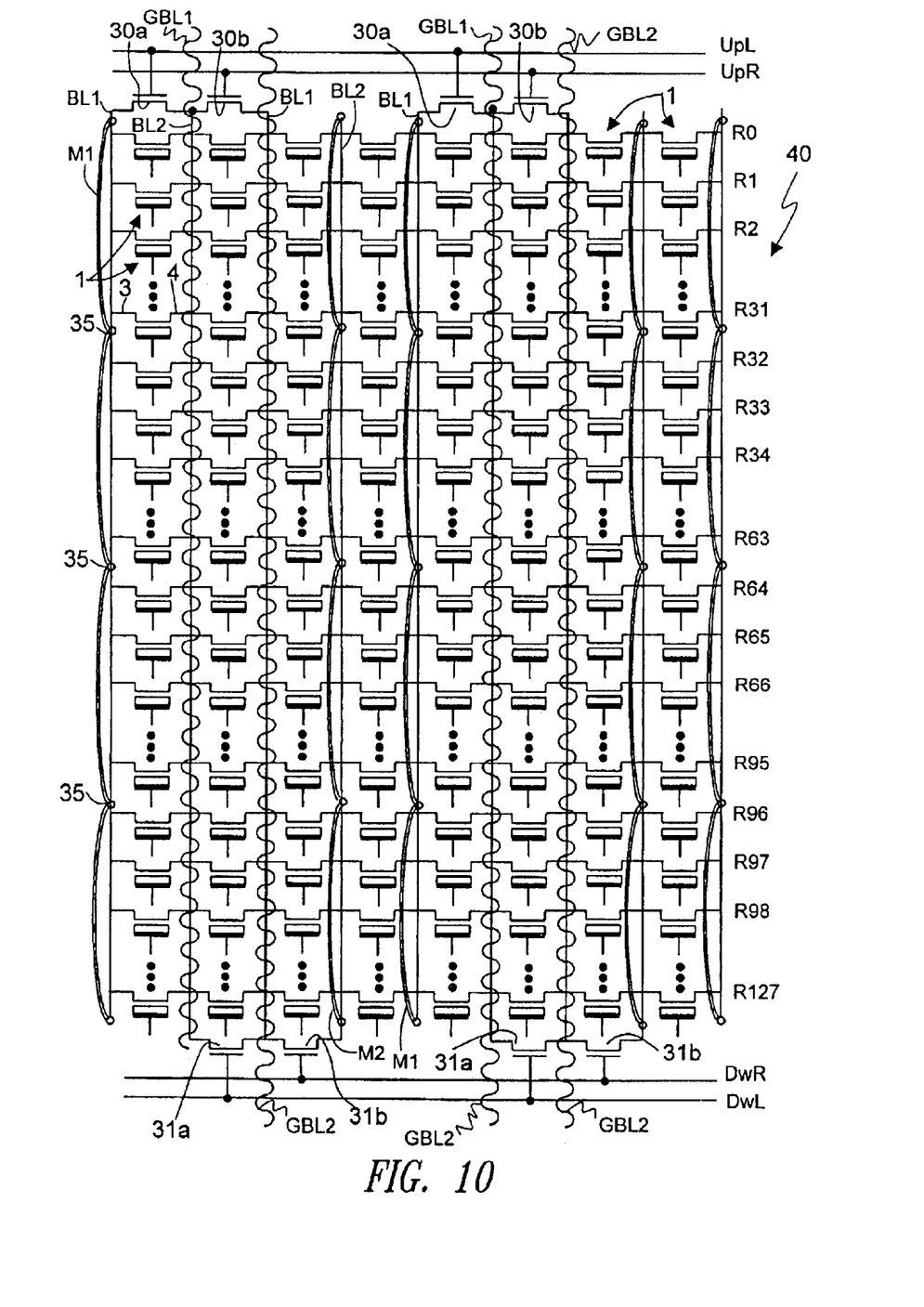
FIG. 10 shows the architecture of a portion of an NROM memory array according to the invention.

The considerable reduction in the spurious erasing moreover makes it possible to connect a larger number of cells to a same bitline and thus to increase the number of rows of a sector or subsector, reducing the number of required selectors, and thus the memory bulk, and simplifying the memory geometry, as evident comparing FIGS. 9 and 10.

FIGS. 9 and 10 show the architecture of portions of an NROM memory array according to the prior art and according to the invention, respectively. Both the solutions use an architecture of a hierarchical type, at least as regards bitlines. The bitlines BL1 and BL2 of FIG. 2 thus correspond to the local bitlines BL1, BL2 of FIG. 9.

In detail, in FIG. 9, the cells 1 are aligned along thirty-two rows and along a plurality of columns (only some of which shown). Each cell 1 is connected to a first local bitline BL1 and to a second local bitline BL2, and each local bitline BL1, BL2 is connected to two cells 1 adjacent in the direction of the rows (virtual ground architecture). As explained previously, the local bitlines BL1, BL2 are formed via diffusion inside the substrate 2 and form the first and the second conductive regions 3, 4 of FIG. 1.

The first and the second local bitlines BL1, BL2 are connected to first and second global bitlines GBL1, GBL2, only the top and bottom parts whereof are shown, since they are arranged on top of some of the local bitlines BL1, BL2 (they are made in the first or second metal level). Specifically, the first local bitlines BL1 of each pair are connected to a same first global bitline GBL1 through a pair of selectors 30a, 30b formed by NMOS transistors. The selectors 30a are controlled by a signal UpL, while the selectors 30b are controlled by a signal UpR.

Likewise, the second local bitlines BL2 of each pair are connected to a same second global bitline GBL2 through a pair of selectors 31a, 31b formed by NMOS transistors. The selectors 31a are controlled by a signal DwL, while the selectors 31b are controlled by a signal DwR.

For reasons of clarity, the wordlines, one for each row R0, R1, . . . , R31, are not illustrated.

As explained above, spurious erasing during programming of the cells 1 limits the connection of each local bitline BL1, BL2 to not more than thirty-two cells and thus calls for the need to set pairs of selectors 30a, 30b and pairs of selectors 31a, 31b (and the corresponding control lines) every thirty-two rows. For a group of 128 rows, for each column of cells 1 four selectors 30a, 30b and four selectors 31a, 31b (and corresponding control lines) are thus necessary, with evident expenditure in terms of space.

FIG. 10 illustrates the architecture of a memory array 40 which can be made according to the invention, referring to a group of 128 rows (only some of which are shown). In this figure, the same reference numbers as in FIG. 9 are adopted. In addition, FIG. 10 shows some metal lines M1, M2 formed in the first metal level. The metal lines M1, M2 extend above the first and second local bitlines BL1, BL2 and are connected to the latter by contacts 35, one contact every thirty-two rows, in order to reduce their resistivity, using the strapping technique, as known to persons skilled in the art. Although only some of the metal lines are shown, the metal lines M1 extend over all the first local bitlines BL1 and the metal lines M2 extend over all the second local bitlines BL2. Also shown in FIG. 10, with a wavy line, the global bitlines GBL1, GBL2 are formed in the second metal level.

As may be noted, for biasing the first conductive regions 3 and the second conductive regions 4 of 128 cells 1 arranged on a same column, two selectors 30a, 30b and two control lines are sufficient, thus reducing considerably the space occupied and thus the costs of the memory.

Finally, it is clear that numerous modifications and variations may be made to the method and memory described and illustrated herein, all of which fall within the scope of the present invention, as defined in the attached claims. For example, the voltage generator 62 may be of a trimmerable type, so as to adapt the row offset voltage Voff to the requirements of the memory.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. An NROM device comprising:

a memory array, formed by a plurality of memory cells organized in rows and columns and provided with first conductive regions formed in a semiconductor body and connected to first bitlines, second conductive regions formed in said semiconductor body and connected to second bitlines, charge storage regions of insulating material, formed on top of said semiconductor body, and gate regions arranged on top of said charge storage regions and connected to respective wordlines; and a programming circuit for a selected cell connected to a selected one of the wordlines, the programming circuit having a plurality of drivers, including a first driver and second drivers, said first driver supplying a first voltage of a first value with respect to said semiconductor body to the selected one of said wordlines, and said second drivers configured to supply a second voltage having a non-zero second value, lower than said first value, to a plurality of said wordlines, excluding said selected wordline, each of said plurality of drivers having a signal input receiving a control signal, an output connected to a respective one of the wordlines, a first supply input connected to a first supply line, set at said first voltage, and a second supply input connected to a controllable biasing circuit.

2. The device according to claim 1 wherein said controllable biasing circuit comprises:

a changeover switch having a first input connected to a reference potential point;

a second input connected to a voltage generator, which supplies said second voltage;

an output connected to said second supply input of said drivers of said plurality of drivers; and a control input configured to receive a switching signal.

3. The device according to claim 2 wherein said controllable biasing circuit comprises:

a load element connected between a second supply line and said output of said controllable biasing circuit, said load element being activated by said switching signal;

a switch connected between said output of said controllable biasing circuit and said reference potential point, said switch being driven by said switching signal in phase opposition with respect to said load element; and a diode, connected between said output of said controllable biasing circuit and said reference potential point.

4. The device of claim 1, further comprising a plurality of metal lines, each extending above a respective one of the first or second bitlines and electrically coupled thereto at regular intervals.

5. The device of claim 4 wherein the regular intervals each comprise thirty-two rows.

6. The device of claim 4 wherein the electrical coupling is formed by contacts extending between each of the metal lines and the respective bitline at the regular intervals.

7. A device, comprising:
a memory array, having a plurality of memory cells organized in rows and columns, and provided with a first plurality of conductive regions formed in a semiconductor body as first bitlines, a second plurality of conductive regions formed in the semiconductor body as second bitlines, a plurality of charge storage regions formed on top of the semiconductor body in columns, each column of charge storage regions being formed between respective ones of the first and second bitlines or between respective ones of the second and first bitlines, and a respective gate region arranged on top of each of the plurality of charge storage regions and connected in rows to one of a plurality of wordlines; and
a plurality of drivers, each having an output terminal coupled to a respective one of the wordlines, a signal input adapted to receive a selection signal, a supply input coupled to a voltage supply, and a biasing input coupled to a biasing line, each driver being configured to provide at its output terminal a voltage level present at the supply input when the selection signal at its signal input is at a select level and to provide at its output terminal a voltage level present at the biasing input when the selection signal at its signal input is at a deselect level; and
a biasing circuit having an output coupled to the biasing line and configured to apply a first or second voltage level to the biasing line, selectively.

8. The device of claim 7 wherein the biasing circuit is configured to select the first voltage level while the memory array is subject to read or erase operations, and the second voltage level while the memory array is subject to program operations.

9. The device of claim 7 wherein the biasing circuit is coupled to a supply voltage, and the circuit includes a divider network configured to provide a selected portion of the supply voltage to the biasing line as the second voltage level.

10. The device of claim 7 wherein the second voltage level is in a range of about 0.5–1.5 volts.

11. The device of claim 7 wherein the second voltage level is about 1 volt.

12. The device of claim 7, further comprising a plurality of metal lines, each extending above a respective one of the first or second pluralities of conductive regions and electrically coupled thereto at regular intervals.

13. The device of claim 12 wherein the regular intervals each comprise thirty-two rows.

14. A device, comprising:
a memory array, having a plurality of memory cells organized in rows and columns, and provided with a first plurality of conductive regions formed in a semiconductor body as first bitlines, a second plurality of conductive regions formed in the semiconductor body as second bitlines, a plurality of charge storage regions formed on top of the semiconductor body in columns, each column of charge storage regions being formed between respective ones of the first and second bitlines, and a respective gate region arranged on top of each of the plurality of charge storage regions and connected in rows to one of a plurality of wordlines; and
a plurality of metal lines, each extending above a respective one of the first or second pluralities of conductive regions and electrically coupled thereto at regular intervals.

15. The device of claim 14 wherein the regular intervals each comprise thirty-two rows.

16. The device of claim 14 wherein the electrical coupling is formed by contacts extending between each of the metal lines and the respective conductive region at the regular intervals.

* * * * *